(12) United States Patent
Kim

(10) Patent No.: US 11,923,033 B2
(45) Date of Patent: Mar. 5, 2024

(54) SEMICONDUCTOR DEVICE

(71) Applicant: SK hynix Inc., Icheon-si (KR)

(72) Inventor: Jae Taek Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/737,294

(22) Filed: May 5, 2022

(65) Prior Publication Data

US 2023/0298632 A1 Sep. 21, 2023

(30) Foreign Application Priority Data

Mar. 15, 2022 (KR) .................. 10-2022-0031881

(51) Int. Cl.
*G11C 5/02* (2006.01)
*H10B 63/00* (2023.01)

(52) U.S. Cl.
CPC ............. *G11C 5/025* (2013.01); *H10B 63/84* (2023.02)

(58) Field of Classification Search
CPC ........ G11C 5/025; H10B 63/84; H10B 43/30; H10B 41/27; H10B 41/30; H10B 41/40; H10B 43/27; H10B 43/40
USPC .................................................. 365/51
See application file for complete search history.

(56) References Cited

U.S. PATENT DOCUMENTS 11,069,707 B2 * 7/2021 Tanabe ............... H10B 43/27
2023/0255023 A1 * 8/2023 Xu ..................... H10B 41/27
257/314

FOREIGN PATENT DOCUMENTS

CN 112928136 A * 6/2021 ......... G11C 11/5692
KR 1020210060853 A 5/2021

* cited by examiner

*Primary Examiner* — Fernando Hidalgo
(74) *Attorney, Agent, or Firm* — William Park & Associates Ltd.

(57) ABSTRACT

A semiconductor device includes: a first memory block having a first block pitch; and a second memory block belonging to a same plane as the first memory block, the second memory block located closer to a plane edge than the first memory block, the plane edge being an edge of the plane, wherein the second memory block has a second block pitch that is larger than the first block pitch.

14 Claims, 10 Drawing Sheets

SEMICONDUCTOR DEVICE

CROSS-REFERENCE TO RELATED APPLICATION

This application claims priority under 35 U.S.C. § 119 to Korean Patent Application No. 10-2022-0031881 filed on Mar. 15, 2022, which is incorporated herein by reference in its entirety.

BACKGROUND

1. Technical Field

Exemplary embodiments relate to an electronic device, and more particularly, to a semiconductor device.

2. Related Art

The integration degree of a semiconductor device is mainly decided by an area occupied by a unit memory cell. Recently, as the improvement in integration degree of a semiconductor device having memory cells formed as a single layer on a substrate reaches the limit, a 3D semiconductor device having memory cells stacked on a substrate has been suggested. Furthermore, in order to improve the operation reliability of such a semiconductor device, various structures and fabrication methods are being developed.

SUMMARY

In an embodiment, a semiconductor device may include: a first memory block having a first block pitch; and a second memory block belonging to a same plane as the first memory block, the second memory block located closer to a plane edge than the first memory block, the plane edge being an edge of the plane, wherein the second memory block has a second block pitch that is larger than the first block pitch.

In an embodiment, a semiconductor device may include: a first stack including first conductive layers and first insulating layers that are alternately stacked; a first channel structure penetrating the first stack; a second stack including second conductive layers and second insulating layers that are alternately stacked; a second channel structure penetrating the second stack; and a slit structure located between the first stack and the second stack. The first channel structure and the slit structure may be spaced apart by a first distance from each other. The second channel structure and the slit structure may be spaced apart by a second distance from each other. The second distance may be larger than the first distance.

In an embodiment, a semiconductor device may include: a memory plane; and a plurality of memory blocks having different block pitches, included in the memory plane. A size of a memory block's block pitch may be inversely proportional to its distance from an edge of the memory plane.

DETAILED DESCRIPTION

Various embodiments are directed to a semiconductor device having a stable structure and an improved characteristic.

In accordance with the present embodiments, it is possible to improve the integration degree of a semiconductor device by stacking memory cells in a 3D manner. Furthermore, it is possible to provide a semiconductor device having a stable structure and improved reliability.

Hereafter, embodiments in accordance with the technical spirit of the present disclosure will be described with reference to the accompanying drawings.

Figure 1A:
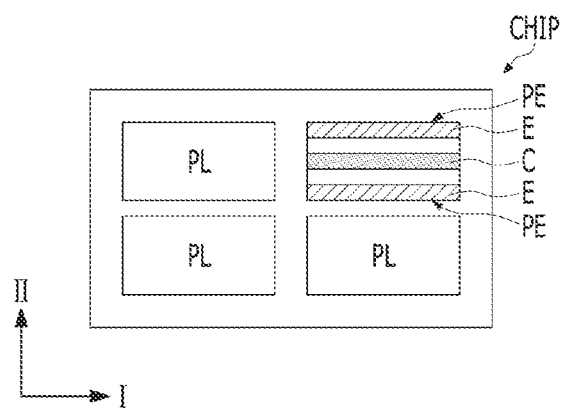
FIGS. 1A to 1C are diagrams illustrating the structure of a semiconductor device in accordance with an embodiment.
Figure 1B:
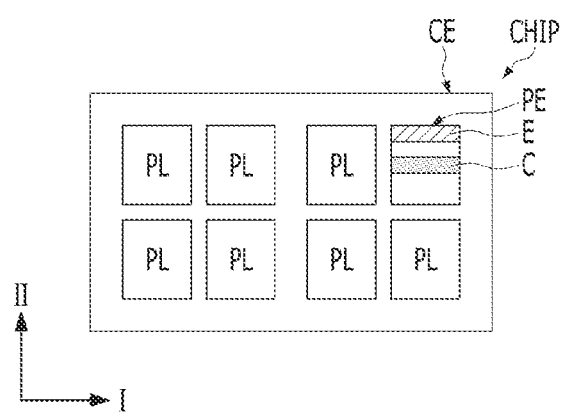
Figure 1C:
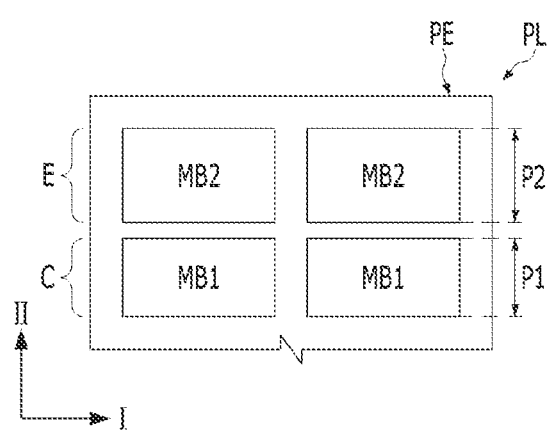

FIGS. 1A to 1C are diagrams illustrating the structure of a semiconductor device in accordance with an embodiment.

Referring to FIGS. 1A and 1B, the semiconductor device may include a chip CHIP, and the chip CHIP may include a plurality of planes PL, The chip CHIP may be a semiconductor chip, a memory chip, or the like. The planes PL may be a memory plane. The planes PL may be arranged in one direction or arranged in a matrix shape. In an embodiment, the planes PL may be arranged in a first direction I and a second direction II that crosses the first direction I. Specifically, the first direction I may be perpendicular to the second direction II.

Each of the planes PL may include an edge region E and a center region C. The edge region E may be defined as a predetermined width along an edge of a plane, a plane edge PE, Referring to FIG. 1A, the edge regions E may be defined along the plane edges PE that are farthest towards the second direction II, respectively. Referring to FIG. 1B, the edge region E may be defined along the plane edge PE, which is close to a chip edge CE. The center region C may be a region that is spaced apart farther from the plane edge PE than the edge region E. The plane PL may include the edge region E and the center region C. The other region of the plane PL except the edge region E may be the center region C. Alternatively, a partial region that includes the center of the plane PL may be defined as the center region C.

Referring to FIG. 1C, the plane PL may include a plurality of memory blocks MB1 and MB2. The memory blocks MB1 and MB2 may each include memory cells for storing data. The memory block may be the unit by which data is erased. In the plane PL, the memory blocks MB1 and MB2 may be arranged in the first direction I, arranged in the second direction II, or arranged in the first direction I and the second direction II, In an embodiment, the first memory block MB1 may be adjacent to the second memory block MB2 in the second direction II.

The first memory block MB1 and the second memory block MB2 may belong to the same plane PL, The second memory block MB2 may be located closer to the plane edge PE than the first memory block MB1. In an embodiment, the second memory block MB2 may be located in the edge region E, and the first memory block MB1 may be located in the center region C.

The first memory block MB1 and the second memory block MB2 may have different sizes. Here, "size" may indicate the physical size of a memory block and may correspond to an area on a plane that is defined in the first direction I and the second direction II. In an embodiment, the first memory block MB1 and the second memory block MB2 may have different block pitches.

The first memory block MB1 may have a first block pitch P1, and the second memory block MB2 may have a second block pitch P2, The second block pitch P2 may be larger than the first block pitch P1, Specifically, the second block pitch P2 may be equal to or less than 1.5 times the first block pitch P1. The block pitch may indicate the width of each of the memory blocks MB1 and MB2 in the second direction II. The first memory block MB1 may be adjacent to the second memory block MB2 in a block pitch direction, i.e., the second direction II.

The first memory block MB1 and the second memory block MB2 may have different functions. In an embodiment, the first memory block MB1 may be a real memory block, and the second memory block MB2 may be a dummy memory block. The real memory block may include memory cells for storing data. The dummy memory block may have the same structure as or a similar structure to the real memory block. However, the dummy memory block might not store data therein. Alternatively, the dummy memory block may be a redundancy memory block and may include redundancy memory cells for a repair operation.

In accordance with the above-described structure, a memory block, such as memory block MB2 of FIG. 1C, located closer to the plane edge PE, may have a larger block pitch than a memory block, such as memory block MB1 of FIG. 1C, located farther from the plane edge PE. Therefore, it is possible to minimize or prevent a defect which occurs during a process of fabricating a memory block that is located in the edge region E. Furthermore, the memory block that is located in the edge region E may have a stable structure.

Figure 2A:
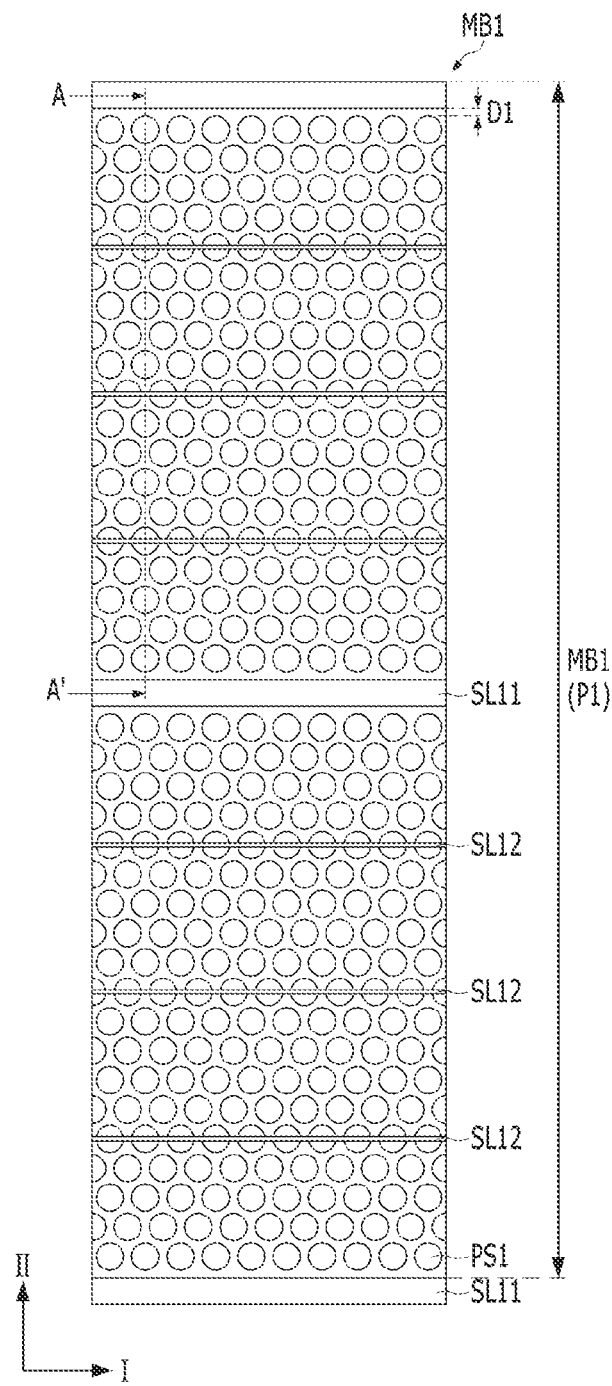
FIGS. 2A and 2B are diagrams illustrating the structure of a semiconductor device in accordance with an embodiment.
Figure 2B:
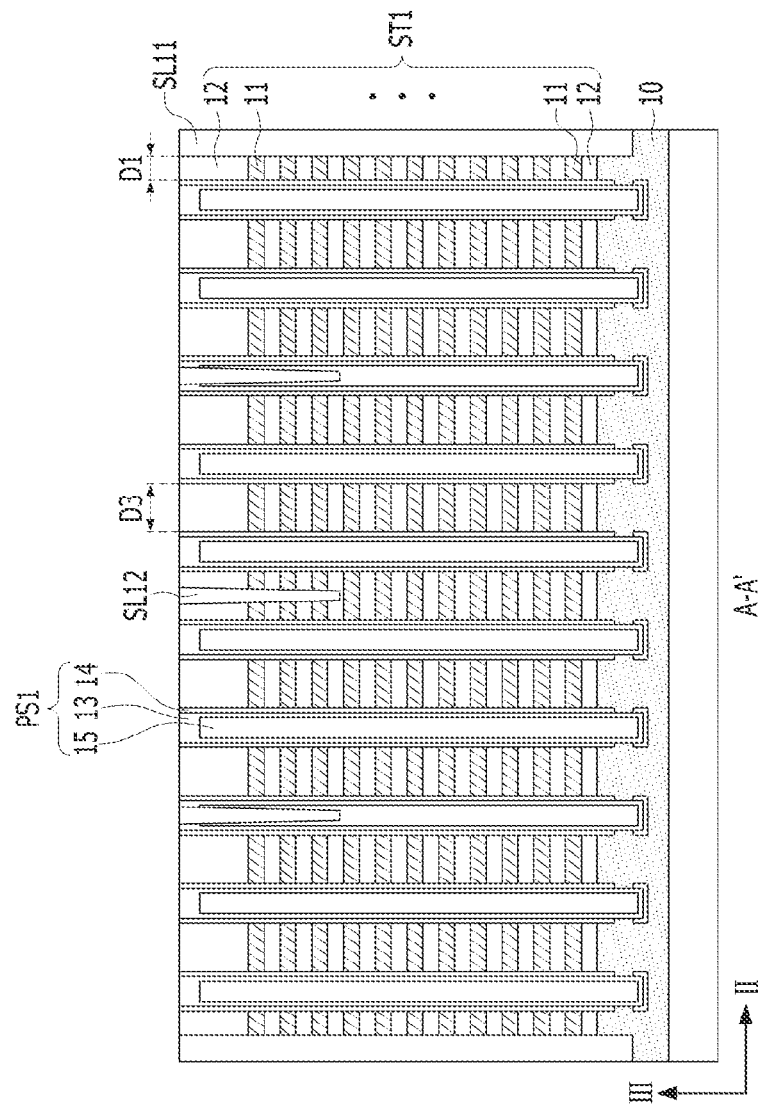
Figure 3A:
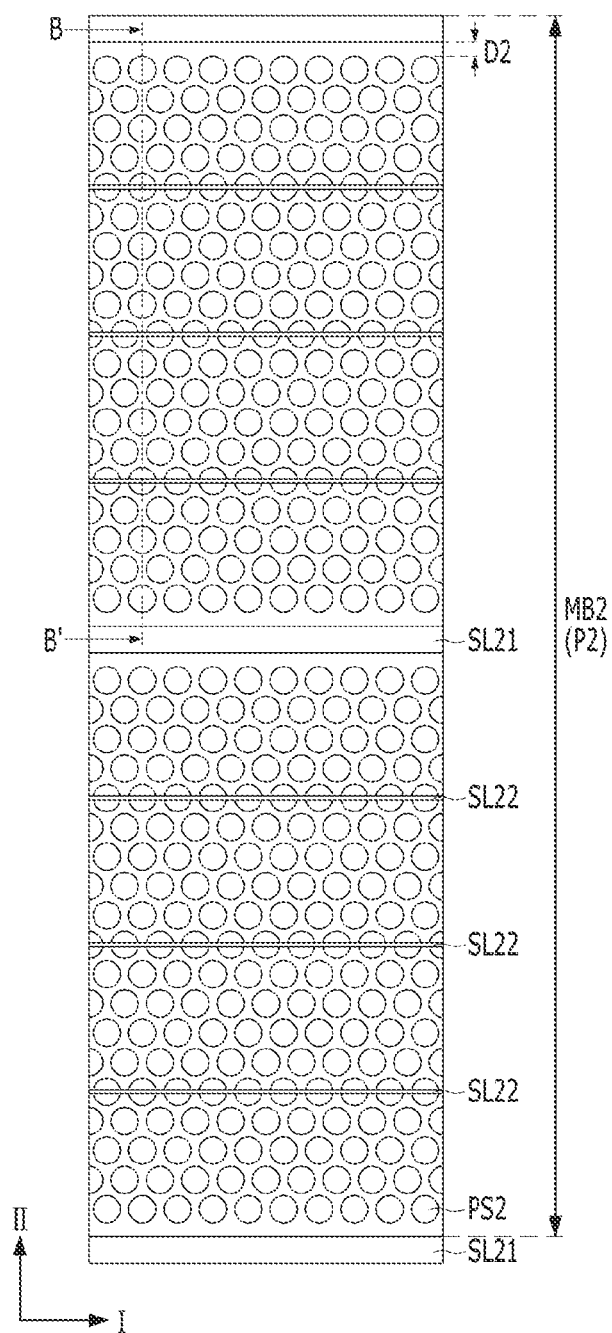
FIGS. 3A and 3B are diagrams illustrating the structure of a semiconductor device in accordance with an embodiment.

FIGS. 2A, 2B, 3A, and 3B are diagrams illustrating the structure of a semiconductor device in accordance with an embodiment. FIG. 2A may be a plan view, and FIG. 2B may be a cross-sectional view taken along line A-A' of FIG. 2A. FIG. 3A may be a plan view, and FIG. 3B may be a cross-sectional view taken along line B-B' of FIG. 3A. Hereafter, contents overlapping with the above-described contents will be omitted.

Referring to FIGS. 2A and 2B, the semiconductor device may include a first memory block MB1, The first memory block MB1 may include a first stack ST1 and a first penetration structure PS1. The first memory block MB1 may further include a first source structure 10, a first slit structure SL11, a second slit structure SL12, or a combination thereof.

The first stack ST1 may include first conductive layers 11 and first insulating layers 12 that are alternately stacked. The first conductive layers 11 may be word lines, bit lines, select lines, or the like. The first conductive layers 11 may include conductive materials, such as polysilicon, tungsten, molybdenum, and metal. The first insulating layers 12 may serve to insulate the stacked first conductive layers 11 from each other. The first insulating layers 12 may include oxide, nitride, air gap, and the like.

The first penetration structure PS1 may penetrate the first stack ST1. The first penetration structure PS1 may penetrate the first stack ST1 in a third direction III, The third direction III may indicate a direction that protrudes from or penetrates the plane that is defined by the first direction I and the second direction II. In an embodiment, the third direction III may indicate a stacking direction. The third direction III may be perpendicular to both the first direction I and the second direction II.

At the respective intersections between the first penetration structure PS1 and the first conductive layers 11, first memory cells may be located. Along the first penetration structure PS1, the first memory cells may be stacked. The first memory block MB1 may be a real memory block, and the first memory cells may be real memory cells.

In an embodiment, the first penetration structure PS1 may be a channel structure. The channel structure may include a channel layer 13 that penetrates the first stack ST1, The channel structure may further include a memory layer 14 that covers the outer wall of the channel layer 13, an insulating core 15 within the channel layer 13, or a combination thereof. The memory layer 14 may include a tunneling layer, a data storage layer, a blocking layer, or a combination thereof. The channel structure may be connected to the first source structure 10 through the first stack ST1. The channel layer 13 may be directly connected to the first source structure 10 or connected to the first source structure 10 through a semiconductor pattern that is grown through an epitaxial method.

In an embodiment, the first penetration structure PS1 may be an electrode structure. The electrode structure may include an electrode layer that penetrates the first stack ST1 and may further include a memory layer that covers the outer wall or inner wall of the electrode layer. The memory layer may include a variable resistance material.

The first slit structure SL11 may penetrate the first stack ST1. The first slit structure SL11 may extend in the first direction. The second slit structure SL12 may penetrate the first stack ST1. The second slit structure SL12 may extend in the first direction I. The second slit structure SL12 may overlap with the first penetration structure PS1. Between the pair of first slit structures all, at least one second slit structure SL12 may be located.

The first slit structure and the second slit structure SL12 may penetrate the first stack ST1 to different depths. The second slit structure SL12 may penetrate the first stack ST1 to a smaller depth than the first slit structure all. The second slit structure SL12 may penetrate to a depth that penetrates at least one uppermost first conductive layer 11.

Figure 3B:
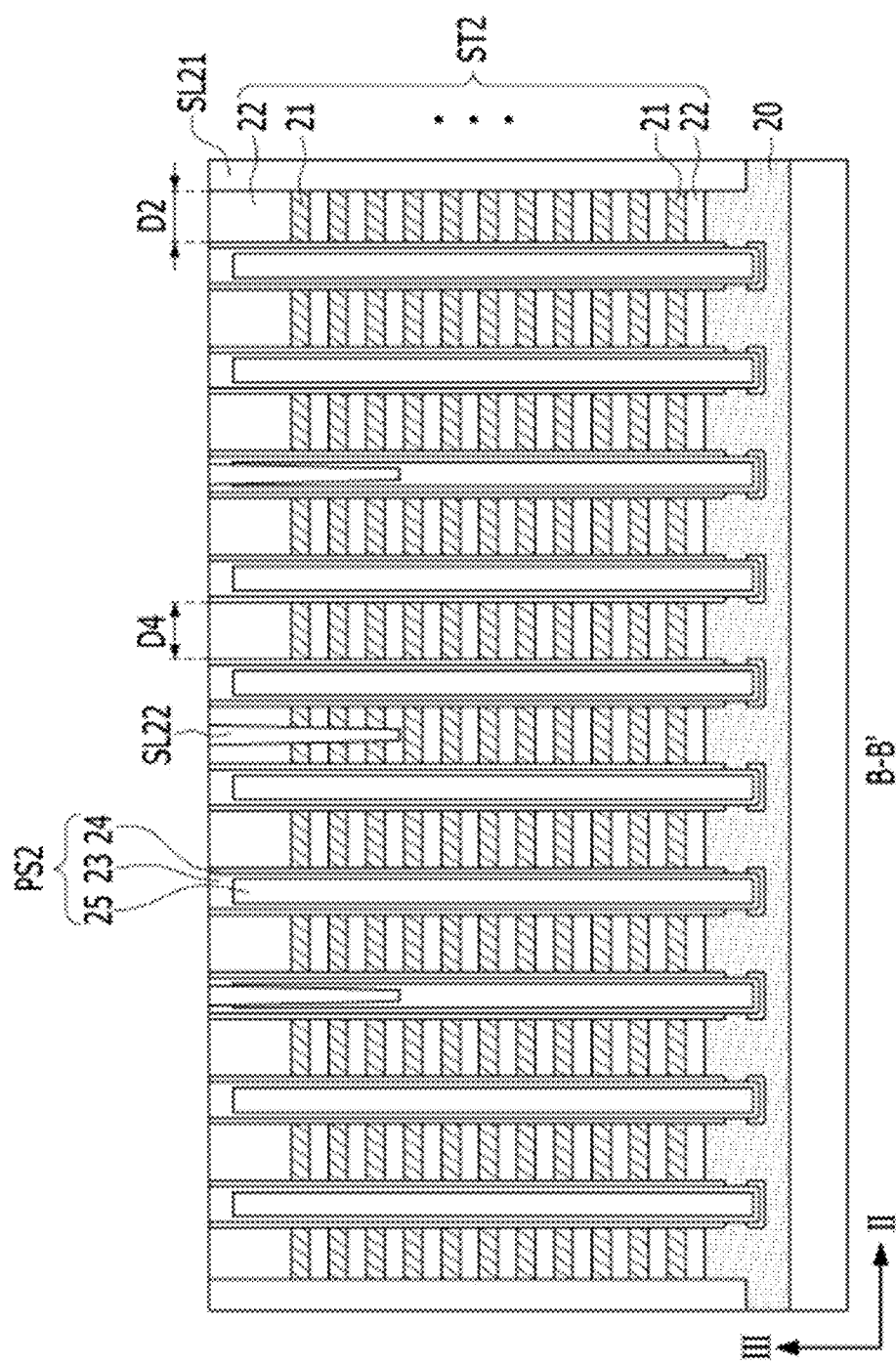

Referring to FIGS. 3A and 3B, the semiconductor device may include a second memory block MB2. The second memory block MB2 may include a second stack ST2 and a second penetration structure PS2. The second memory block MB2 may further include a second source structure 20, a first slit structure SL21, a second slit structure SL22, or a combination thereof.

The second stack ST2 may include second conductive layers 21 and second insulating layers 22 that are alternately stacked. The second conductive layers 21 may be word lines, bit lines, select lines, or the like. The second conductive layers 21 may include conductive materials, such as polysilicon, tungsten, molybdenum, and metal. The second insulating layers 22 may serve to insulate the stacked second conductive layers 21 from each other. The second insulating layers 22 may include oxide, nitride, air gap, and the like.

The second penetration structure PS2 may penetrate the second stack ST2. At the respective intersections between the second penetration structure PS2 and the second conductive layers 21, second memory cells may be located. Along the second penetration structure PS2, the second memory cells may be stacked. The second memory block M32 may be a dummy memory block, and the second memory cells may be dummy memory cells.

In an embodiment, the second penetration structure PS2 may be a channel structure. The channel structure may include a channel layer 23 that penetrates the second stack ST2, The channel structure may further include a memory layer 24 that covers the outer wall of the channel layer 23, an insulating core 25 within the channel layer 23, or a combination thereof. The memory layer 24 may include a tunneling layer, a data storage layer, a blocking layer, or a combination thereof. The channel structure may be connected to the second source structure 20 through the second stack ST2. The channel layer 23 may be directly connected to the second source structure 20 or may be connected to the second source structure 20 through a semiconductor pattern that is grown through an epitaxial method.

In an embodiment, the second penetration structure PS2 may be an electrode structure. The electrode structure may include an electrode layer that penetrates the second stack ST2 and may further include a memory layer that covers the outer wall or inner wall of the electrode layer. The memory layer may include a variable resistance material.

The first slit structure SL21 may penetrate the second stack ST2. The first slit structure SL21 may extend in the first direction. The second slit structure SL22 may penetrate the second stack ST2. The second slit structure SL22 may extend in the first direction I. The second slit structure SL22 may overlap with the second penetration structure PS2. Between the pair of first slit structures SL21, at least one second slit structure SL22 may be located.

The first slit structure and the second slit structure SL22 may penetrate the second stack ST2 to different depths. The second slit structure SL22 may penetrate the second stack ST2 to a smaller depth than the first slit structure SL21. The second slit structure SL22 may penetrate to a depth that penetrates at least one uppermost second conductive layer 21.

Referring to FIGS. 2A and 3A, the first memory block MB1 may have a first block pitch P1, and the second memory block MB2 may have a second block pitch P2 that is different from the first block pitch P1. The second memory block MB2 may be located closer to the plane edge than the first memory block MB1, and the second block pitch P2 may be larger than the first block pitch P1.

Referring to FIGS. 2A, 2B, 3A, and 3B, the first penetration structures PS1 in the first memory block MB1 may be spaced apart from each other by a third distance D3. The first penetration structure PS1 and the first slit structure all may be spaced apart from each other by a first distance D1. The distance between the first slit structure all and the first penetration structure PS1 that is located closest to the first slit structure all, among the first penetration structures PS1, may be the first distance D1, In an embodiment, the first distance D1 may be the distance between the edge of the first penetration structure PS1 and the edge of the first slit structure all in the second direction II.

In the second memory block MB2, the second penetration structures PS2 may be spaced apart from each other by a fourth distance D4. The third distance D3 and the fourth distance D4 may be substantially equal to or different from each other. The second penetration structure PS2 and the first slit structure SL21 may be spaced apart from each other by the second distance D2, the second distance D2 being different from the first distance D1. The distance between the first slit structure SL21 and the second penetration structure PS2 that is located closest to the first slit structure SL21, among the second penetration structures PS2, may be the second distance D2. In an embodiment, the second distance D2 may be the distance between the edge of the second penetration structure PS2 and the edge of the first slit structure SL21 in the second direction II. The second distance D2 may be greater than the first distance D1. Specifically, the second distance D2 may be equal to or less than two times the first distance D1. Such a structure may sufficiently secure the distance between the second penetration structure PS2 and the first slit structure SL21 in the second memory block MB2. Furthermore, such a structure may selectively increase only the block pitch of the second memory block MB2, among the plurality of memory blocks belonging to the plane, located closer to the plane edge than the first memory block MB1.

In accordance with the above-described structure, the second memory block MB2 that is located closer to the plane edge than the first memory block MB1 may have the relatively large second block pitch P2 compared to the first block pitch P1. In the second memory block MB2, the fourth distance D4 may be substantially equal to the third distance D3, and the second distance D2 may be greater than the first distance D1. As the size of a memory block is adjusted depending on the position of the memory block, the memory blocks may have stable structures. In particular, a memory block that is located close to the plane edge may have a stable structure.

Figure 4:
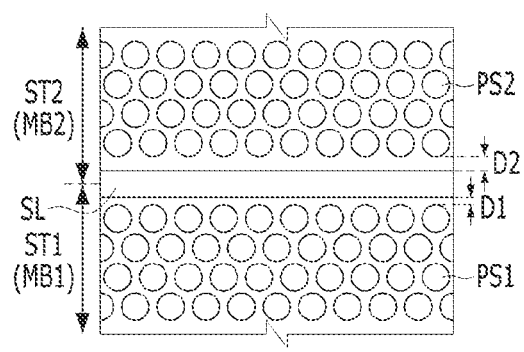
FIG. 4 is a diagram illustrating the structure of a semiconductor device in accordance with an embodiment.

FIG. 4 is a diagram illustrating the structure of a semiconductor device in accordance with an embodiment. Hereafter, contents overlapping with the above-described contents will be omitted.

Referring to FIG. 4, the semiconductor device may include a first stack ST1, a second stack ST2, a first penetration structure PS1, a second penetration structure P52, a slit structure SL, or a combination thereof.

The first stack ST1 may include first conductive layers and first insulating layers that are alternately stacked. The first penetration structure PS1 may penetrate the first stack ST1. The second stack ST2 may include second conductive layers and second insulating layers that are alternately stacked. The second penetration structure PS2 may penetrate the second stack ST2. The slit structure SL may be located between the first stack ST1 and the second stack ST2. The slit structure SL may electrically isolate the first stack ST1 and the second stack ST2 from each other.

The first penetration structure PS1 and the slit structure SL may be spaced apart by a first distance D1 from each other. The second penetration structure P52 and the slit structure SL may be spaced apart by a second distance D2 from each other, the second distance D2 being greater than the first distance D1. The second stack ST2 may be located closer to a plane edge than the first stack ST1. The first stack ST1 may belong to the first memory block MB1, and the second stack ST2 may belong to the second memory block MB2. The second memory block MB2 may have a larger block pitch than the first memory block MB1.

Figure 5A:
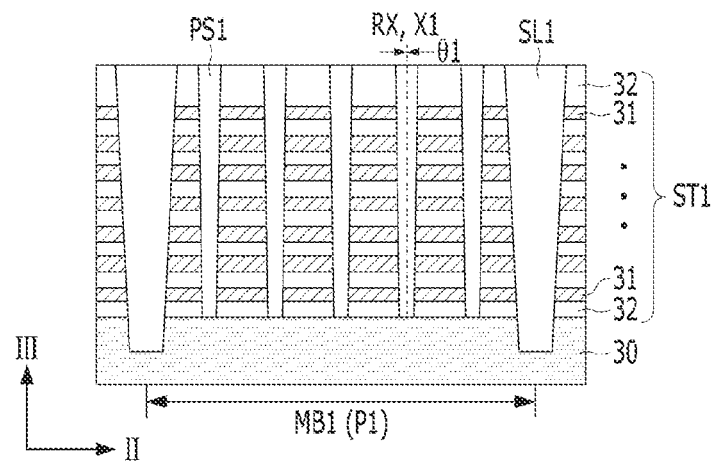
FIGS. 5A and 5B are diagrams illustrating the structure of a semiconductor device in accordance with an embodiment.
Figure 5B:
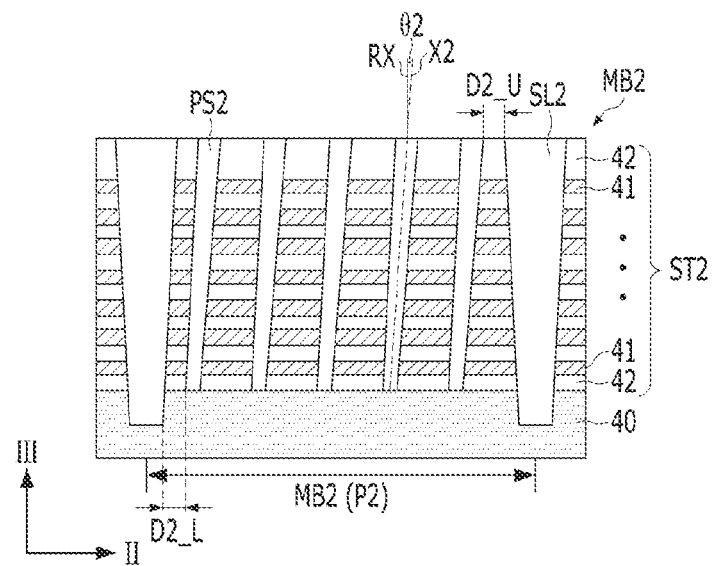

FIGS. 5A and 5B are diagrams illustrating the structure of a semiconductor device in accordance with an embodiment.

Referring to FIG. 5A, the semiconductor device may include a first source structure 30, a first stack ST1, a first penetration structure PS1, a first slit structure SL1, or a combination thereof. The first stack ST1 and the first penetration structure PS1 may belong to the first memory block MB1. The first penetration structure PS1 may have a first axis X1. The first axis X1 may have a first angle $\theta 1$ with respect to a reference axis RX, and the first penetration structure PS1 may penetrate the first stack ST1 at the first angle $\theta 1$. In an embodiment, the reference axis RX may be parallel to the third direction III. The first axis X1 may be substantially the same as the third direction III. Here, "substantially" may indicate that measurement values are equal to each other and may fall within a range including errors in process.

Referring to FIG. 5B, the semiconductor device may include a second source structure 40, a second stack ST2, a second penetration structure PS2, a second slit structure SL2, or a combination thereof. The second stack ST2 and the second penetration structure PS2 may belong to the second memory block MB2, The second memory block MB2 may be located closer to a plane edge than the first memory block MB1.

The second penetration structure PS2 may have a second axis X2. The second axis X2 may have a second angle θ2 with respect to the reference axis RX, and the second penetration structure PS2 may penetrate the second stack ST2 at the second angle θ2. The second angle θ2 may be different from the first angle θ1. The second angle θ2 may be greater than the first angle θ1.

The block pitch of a memory block may be decided by comparing the angle, at which a penetration structure penetrates a stack, to a reference value. The reference value may be a reference for deciding whether to correct the block pitch. When the penetration angle exceeds the reference value, the block pitch of the corresponding memory block may be increased. At this time, the gap between the penetration structures may be retained, and the distance between the slit structure and the penetration structure may be increased based on the increase of the block pitch. Furthermore, depending on how much the penetration angle exceeds the reference value, the increase of the block pitch may be adjusted.

Referring to FIG. 5A, the reference axis RX and the first axis X1 may coincide with each other, and the first angle θ1 may be equal to or less than the reference value. In such a case, the first memory block MB1 may have a first block pitch P1. Referring to FIG. 5B, the second penetration structure PS2 may be tilted toward the second slit structure SL2, The second angle θ2 may be greater than the reference value. In such a case, the second memory block MB2 whose penetration angle is the second angle θ2 may have a larger block pitch than the first memory block MB1 whose penetration angle is the first angle θ1. The second memory block MB2 may have a second block pitch P2 that is larger than the first block pitch P1.

When the first memory block MB1 and the second memory block MB2 have the same block pitch, a defect may occur in a fabrication process of the second memory block MB2. The second memory block MB2 that is located relatively close to the plane edge may have the second angle θ2 that is greater than the reference value, due to the limitations of the process. In this case, the distance between the second penetration structure PS2 and the second slit structure SL2 may be too narrow. The distance between the upper surface of the second penetration structure PS2 and the second slit structure SL2 might not be sufficiently secured. The distance D2_L between the lower surface of the second penetration structure PS2 and the second slit structure SL2 might not be sufficiently secured. Therefore, during a process of forming the second slit structure SL2, the second penetration structure PS2 may be exposed or damaged.

Therefore, in accordance with an embodiment, the second memory block MB2 having the second angle θ2 that is greater than the reference value may have the relatively large second block pitch P2. Such a structure may secure a sufficient distance between the second penetration structure PS2 and the second slit structure SL2, even though the second penetration structure PS2 is tilted due to the limitations of the process.

Figure 6A:
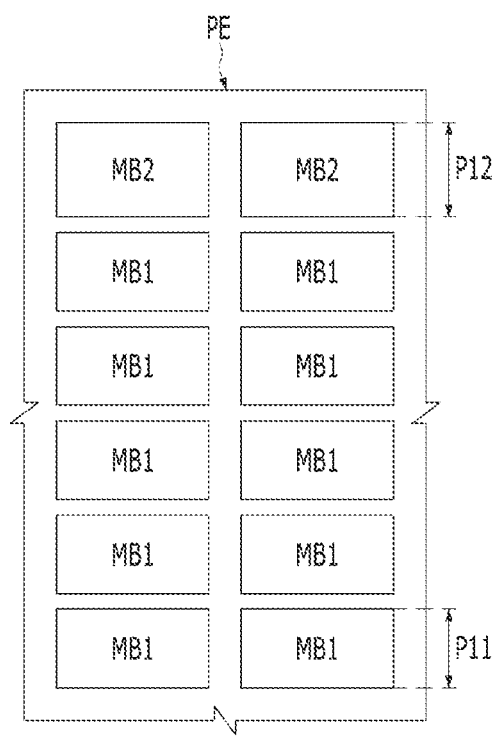
FIGS. 6A to 6C are diagrams illustrating the structure of a semiconductor device in accordance with an embodiment.
Figure 6B:
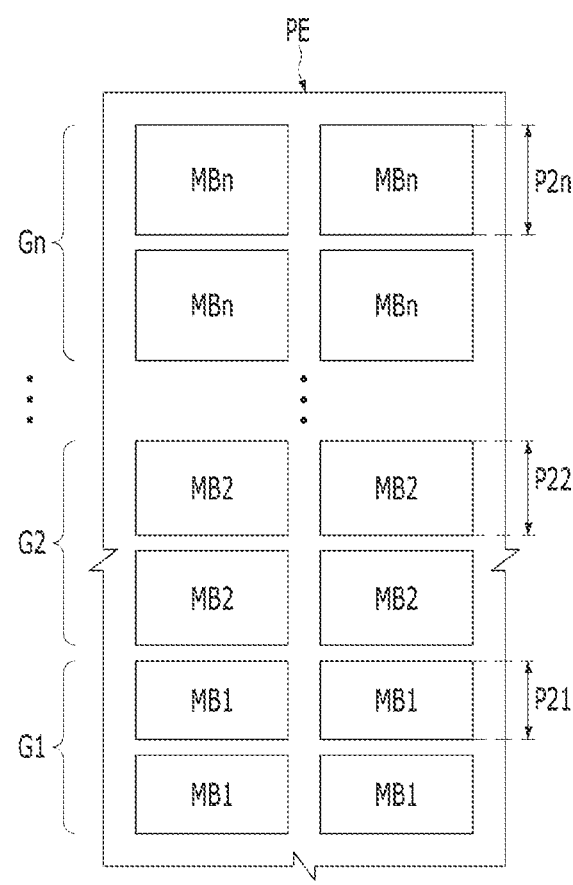
Figure 6C:
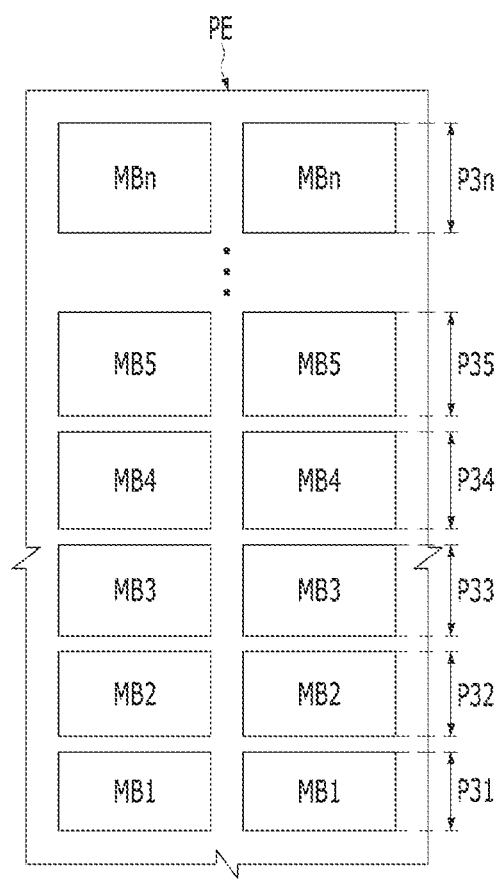

FIGS. 6A to 6C are diagrams illustrating the structure of a semiconductor device in accordance with an embodiment. Hereafter, contents overlapping with the above-described contents will be omitted.

Referring to FIG. 6A, a plane may include a plurality of memory blocks. The plurality of memory blocks that are included in the same plane may have different block pitches. The plurality of memory blocks may include at least one second memory block MB2 located close to the plane edge PE and the other first memory blocks MB1, The first memory blocks MB1 may each have a first block pitch P11. The second memory block MB2 may have a second block pitch P12 that is larger than the first block pitch P11.

Referring to FIG. 6B, the plurality of memory blocks that are included in the same plane may be grouped according to distances between the plurality of memory blocks and the plane edge PE. The plane may include first to $n^{th}$ groups G1 to Gn. The first group G1 may be spaced apart farthest from the plane edge PE, and the $n^{th}$ group Gn may be located closest to the plane edge PE. Here, n may be an integer equal to or greater than 2.

Each of the groups G1 to Gn may include at least one memory block, and the number of memory blocks included in the respective groups G1 to Gn may be equal to or different from one another. The first group G1 may include at least one first memory block MB1, the second group G2 may include at least one second memory block MB2, and the $n^{th}$ group may include at least one $n^{th}$ memory block MBn.

The first to $n^{th}$, groups G1 to Gn may have different block pitches. The memory blocks that are included in the same group may have the same block pitch. The first memory blocks MB1 may each have a first block pitch P21. The nu memory blocks MBn may each have an $n^{th}$ block pitch P2$n$ that is larger than the first block pitch P21. The second memory blocks MB2 may each have a second block pitch P22 that is larger than the first block pitch P21 and smaller than the $n^{th}$ block pitch.

Referring to FIG. 6C, the memory blocks belonging to the same plane may have different block pitches according to distances between the plurality of memory blocks and the plane edge PE. The distance to the plane edge PE may be inversely proportional to the block pitch. A size of a memory block's block pitch may be inversely proportional to its distance from an edge of the memory plane. The first memory block MB1 may be located farthest from the plane edge PE and may have the smallest first block pitch P31. The second memory block MB2 may be located closer to the plane edge than the first memory block MB1 and may have a second block pitch P32 that is larger than the first block pitch P31. The $n^{th}$ memory block MBn may be located closest to the plane edge PE and may have the largest $n^{th}$ block pitch P3$n$.

In accordance with the above-described structure, some memory blocks may have relatively large block pitches in consideration of the distances to the plane edge. Among the memory blocks belonging to the same plane, a memory block located dose to the plane edge may have a relatively large block pitch. Therefore, the block pitches of all the memory blocks do not need to be increased, but only the block pitch of a memory block, which needs to be corrected, may be increased.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a first memory block having a first block pitch, wherein the first memory block includes a first stack and a first channel structure extending through the first stack; and
a second memory block belonging to a same plane as the first memory block, the second memory block located closer to a plane edge than the first memory block, the plane edge being an edge of the plane, wherein the second memory block includes a second stack and a second channel structure extending through the second stack,
wherein the second memory block has a second block pitch that is larger than the first block pitch.

2. The semiconductor device of claim 1, wherein the first memory block is a real memory block, and
wherein the second memory block is a dummy memory block.

3. The semiconductor device of claim 1, wherein the first memory block is adjacent to the second memory block in a block pitch direction.

4. The semiconductor device of claim 1, wherein the second block pitch is equal to or less than 1.5 times the first block pitch.

5. A semiconductor device comprising:
a first memory block having a first block pitch; and
a second memory block belonging to a same plane as the first memory block, the second memory block located closer to a plane edge than the first memory block, the plane edge being an edge of the plane,
wherein the second memory block has a second block pitch that is larger than the first block pitch,
wherein the first memory block comprises a first stack, a first slit structure penetrating the first stack, and a first penetration structure penetrating the first stack, and
wherein the second memory block comprises a second stack, a second slit structure penetrating the second stack, and a second penetration structure penetrating the second stack.

6. The semiconductor device of claim 5, wherein the first penetration structure and the first slit structure are spaced apart by a first distance,
wherein the second penetration structure and the second slit structure are spaced apart by a second distance, and
wherein the second distance is greater than the first distance.

7. The semiconductor device of claim 6, wherein the second distance is equal to or less than two times the first distance.

8. The semiconductor device of claim 5, wherein the second penetration structure is tilted toward the second slit structure.

9. The semiconductor device of claim 5, wherein the first penetration structure penetrates the first stack at a first angle with respect to a reference axis, and
wherein the second penetration structure penetrates the second stack at a second angle that is greater than the first angle with respect to the reference axis.

10. The semiconductor device of claim 1, further comprising a third memory block located between the first memory block and the second memory block, and the third memory having a third block pitch that is larger than the first block pitch and smaller than the second block pitch.

11. The semiconductor device of claim 10, wherein the first memory block, the second memory block, and the third memory block belong to the same plane.

12. A semiconductor device comprising:
a memory plane; and
a plurality of memory blocks having different block pitches, included in the memory plane,
wherein a size of a memory block's block pitch is inversely proportional to its distance from an edge of the memory plane, and
wherein each of the plurality of memory blocks includes a stack and a channel structure extending through the stack.

13. The semiconductor device of claim 1, wherein the first memory block includes first memory cells stacked along the first channel structure, and
wherein the second memory block includes second memory cells stacked along the second channel structure.

14. The semiconductor device of claim 12, wherein each of the plurality of memory blocks includes memory cells stacked along the channel structure.

* * * * *